United States Patent
Jung

(10) Patent No.: US 7,049,239 B2
(45) Date of Patent: May 23, 2006

(54) STI STRUCTURE AND FABRICATING METHODS THEREOF

(75) Inventor: Jin Hyo Jung, Gyeonggi-do (KR)

(73) Assignee: DongbuAnam Semiconductor Inc., Seoul (KR)

( * ) Notice: Subject to any disclaimer, the term of this patent is extended or adjusted under 35 U.S.C. 154(b) by 120 days.

(21) Appl. No.: 10/748,044

(22) Filed: Dec. 31, 2003

(65) Prior Publication Data

US 2004/0259360 A1   Dec. 23, 2004

(30) Foreign Application Priority Data

Jun. 18, 2003   (KR) .................... 10-2003-0039555

(51) Int. Cl.
*H01L 21/311*   (2006.01)
(52) U.S. Cl. .............. 438/700; 438/221; 438/296; 438/692
(58) Field of Classification Search ................ 438/221, 438/296, 689–692, 700, 701, 702, 706, 723, 438/724
See application file for complete search history.

(56) References Cited

U.S. PATENT DOCUMENTS

| | | | |
|---|---|---|---|
| 5,547,903 A | 8/1996 | Hsu | |
| 5,962,879 A | 10/1999 | Ryum et al. | |
| 5,972,776 A * | 10/1999 | Bryant | 438/440 |
| 6,207,532 B1 * | 3/2001 | Lin et al. | 438/424 |
| 6,281,562 B1 | 8/2001 | Segawa et al. | |
| 6,335,247 B1 | 1/2002 | Tews et al. | |
| 6,396,113 B1 | 5/2002 | Fujinaga et al. | |
| 6,479,328 B1 * | 11/2002 | Kim | 438/149 |
| 6,501,117 B1 | 12/2002 | Radens et al. | |
| 6,576,558 B1 * | 6/2003 | Lin et al. | 438/700 |
| 6,689,648 B1 * | 2/2004 | Ko et al. | 438/155 |
| 6,875,663 B1 * | 4/2005 | Iwamatsu et al. | 438/298 |
| 2001/0042890 A1 * | 11/2001 | Liang | 257/374 |
| 2004/0038533 A1 * | 2/2004 | Liang | 438/689 |
| 2004/0132234 A1 * | 7/2004 | Ko et al. | 438/152 |

FOREIGN PATENT DOCUMENTS

KR   10-19990061132   7/1999

* cited by examiner

*Primary Examiner*—Kin-Chan Chen
(74) *Attorney, Agent, or Firm*—Pillsbury Winthrop Shaw Pittman LLP

(57) ABSTRACT

An STI structure and fabricating method thereof are disclosed. The STI fabricating method comprises forming a pad oxide layer and a first nitride layer on a substrate. A trench is formed by etching the first nitride layer, the pad oxide layer and the substrate. An oxide and a second nitride layer are deposited on the surface of the substrate including the trench. A spacer is formed on the lateral walls of the trench by etching the second nitride layer. A buried oxide is grown in the substrate underneath the trench by performing thermal oxidation on the substrate. The trench is then filled by depositing an insulating layer after removing the spacer and performing a planarization process. The STI fabricating method can reduce substantially a total parasitic capacitance. Therefore, gate RC delay is reduced and the operating speed of a transistor increases. In addition, the STI fabricating method can substantially reduce junction leakage because the junction between the bottom of the source/drain and N-well or P-well is not formed. The STI fabricating method can improve isolation characteristics of P-well and N-well, and increase a circuit design margin due to the improvement of latch-up characteristic.

13 Claims, 10 Drawing Sheets

STI STRUCTURE AND FABRICATING METHODS THEREOF

CROSS REFERENCE TO RELATED APPLICATION

This application relates to and claims priority to Korean Patent Application No. 10-2003-0039555, filed on Jun. 18, 2003, which is incorporated herein by reference in its entirety.

BACKGROUND OF THE INVENTION

1. Field of the Invention

The present invention relates to a shallow trench isolation ("STI") structure and fabricating methods for the same. In particular, the present invention relates to an STI structure that can improve an operating speed of a transistor and a latch-up characteristic by changing the STI structure and fabricating methods thereof.

2. Description of Related Art

FIGS. 1a–e illustrate the process steps according a conventional STI fabricating method. In this conventional method, a pad oxide layer 2 is grown on a silicon substrate 1. A nitride layer 3 is then deposited on the pad oxide layer 2 as shown in FIG. 1a. The nitride layer 3, the pad oxide layer 2, and the silicon substrate 1 are then etched to form the trench, as shown in FIG. 1b. A thermal oxide layer 5 is then grown on the etched surface etched, as shown in FIG. 1c. An oxide layer 6 is then deposited on the thermal oxide layer 5 and the nitride layer 3 by atmospheric pressure chemical vapor deposition ("APCVD"). A densification process is then performed. Next, referring to FIG. 1d and FIG. 1e, chemical mechanical polishing ("CMP") is then performed, and, finally, the nitride layer 3 is removed using an HF wet etch to complete an STI forming process. Subsequently, a MOS transistor is then fabricated.

The MOS transistor fabricated by the above-described process may have a parasitic source/drain junction capacitor due to structural features of the structure. As a result, the operating speed of a transistor slows due to an increase in the gate RC delay. Furthermore, a junction between the bottom of source/drain and P-well or N-well may form, which can cause an IC chip to consume a large amount of electric power due to increased junction leakage.

Korean Patent Publication No. 10-1999-0061132 discloses a method for ensuring a process margin by insulating between cells using a silicon on insulator ("SOI") structure and a STI structure to apply a back bias. The method includes performing an oxygen ion implantation for a P-type semiconductor substrate so that the oxygen ion is positioned on a desired depth. A trench is formed on the substrate with a SOI structure having a buried oxide layer formed by a thermal oxidation process and a silicon layer. An STI structure is formed to insulate between a cell in the P-type semiconductor substrate and a cell in the silicon layer so as to apply back bias This process, however, has settled a problem that the insulated layer is floated on the top of the buried oxide.

FIGS. 2a–2e illustrate the process steps according to the fabricating method described in the above-mentioned Korean patent publication. A buried oxide layer 11 and a silicon layer 12 are formed on a semiconductor substrate 10, as shown in FIG. 2a. A trench 13 for making an STI is then formed by etching the silicon layer 12 and the buried oxide layer 11, as shown in FIG. 2b. A spacer 14 is then formed on the inside walls of the trench 13, as shown in FIG. 2c. A field-stop impurity area 15 is then formed in the substrate 10 under the trench 13, as shown in FIG. 2d. An insulating layer 16 is then formed to fill the trench, as shown in FIG. 2e.

This process forms a silicon layer 12 instead of a nitride layer on the buried oxide layer, and provides no clear means for forming the spacer 14. In addition, the spacer 14 is buried by the insulating layer 16, thereby increasing the probability of void formation. As such, this process cannot substantially reduce the source/drain junction capacitance and junction leakage. Furthermore, it cannot improve the operating speed of the transistor and the latch-up characteristic.

BRIEF SUMMARY OF THE INVENTION

Embodiments of the present invention are directed to an STI structure and fabricating methods thereof that substantially obviate one or more of the problems associated with limitations and disadvantages of the related art. An aspect of embodiments of the present invention is to provide a method for fabricating an STI that can improve the operating speed of the transistor and a latch-up characteristic by reducing source/drain junction capacitance and junction leakage. This can be achieved through a change of the STI structure. In accordance with embodiments of the present invention, a method for fabricating an STI is disclosed. The method includes forming a pad oxide layer and a first nitride layer on a substrate. A trench is then formed by etching the first nitride layer, the pad oxide layer and the substrate. The substrate is etched such that the trench is formed with an adequate depth. The substrate can be etched to a depth of approximately 2000 Å. An oxide layer and a second nitride layer are then deposited on the surface and the first nitride layer and in the trench. A spacer is then formed on the lateral walls of the trench by etching the second nitride layer. A buried oxide is grown in the substrate underneath the trench by performing a thermal oxidation process on the substrate. The spacer is then removed. The trench is then filled by depositing an insulating layer. Finally, a planarization process is performed.

The STI fabricating method can substantially reduce a total parasitic capacitance. Therefore, gate RC delay is reduced and the operating speed of a transistor increases. In addition, the STI fabricating method can substantially reduce junction leakage because the junction between the bottom of the source/drain and N-well or P-well is not formed. The STI fabricating method can improve isolation characteristics of P-well and N-well, and increase a circuit design margin due to the improvement of latch-up characteristic.

In accordance with embodiments of the present invention, an STI structure is disclosed. The STI structure includes a trench formed on an isolation area of a substrate. An oxide layer is formed on the lateral walls of the trench. An insulating layer formed in the trench. The structure includes a buried oxide formed in the substrate underneath the trench. The buried oxide has a larger width than that of the trench.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention, wherein like reference numerals designate the elements.

DETAILED DESCRIPTION OF THE PREFERRED EMBODIMENTS

Reference will now be made in detail to the preferred embodiments of the present invention, examples of which are illustrated in the accompanying drawings.

Figure 1A:
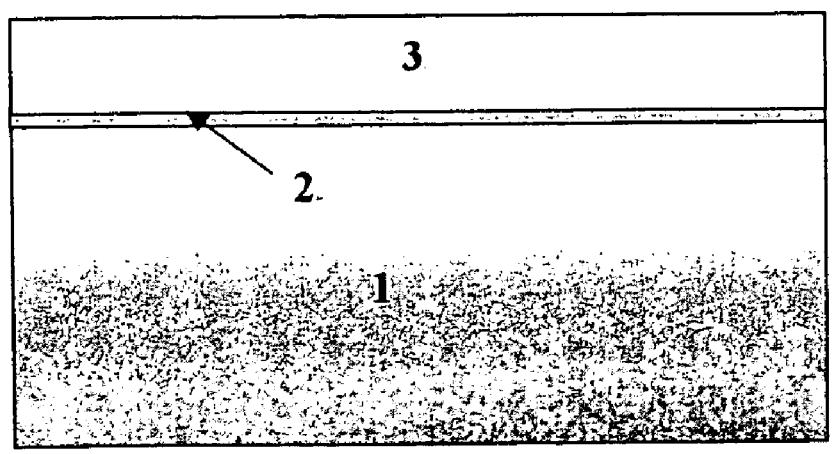
FIGS. 1a–1e illustrate, in cross-sectional views, the process steps according to a conventional STI fabricating method.
Figure 1B:
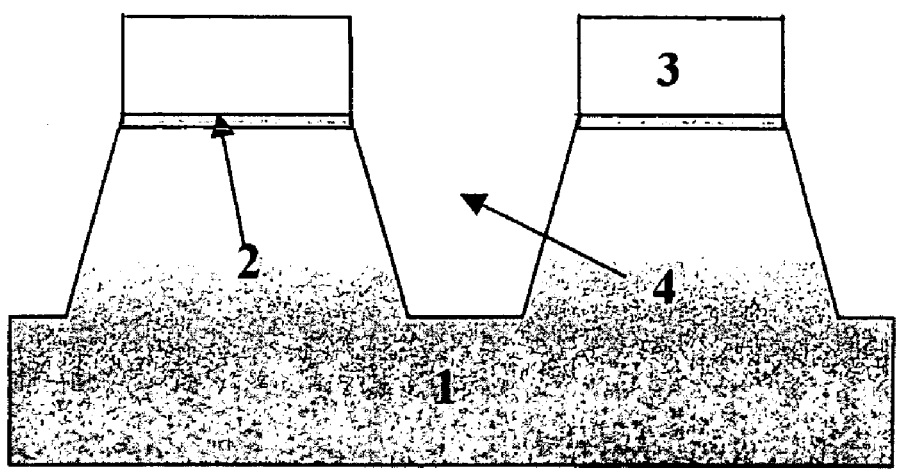
Figure 1C:
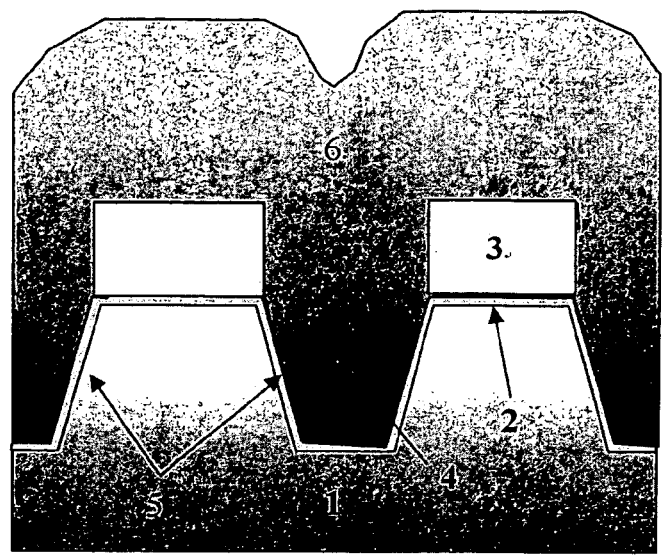
Figure 1D:
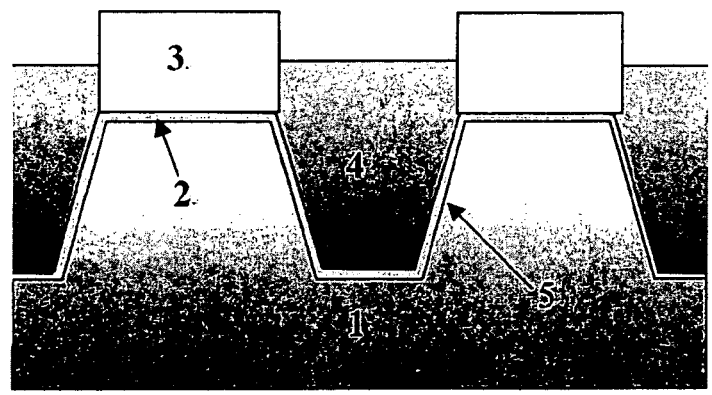
Figure 1E:
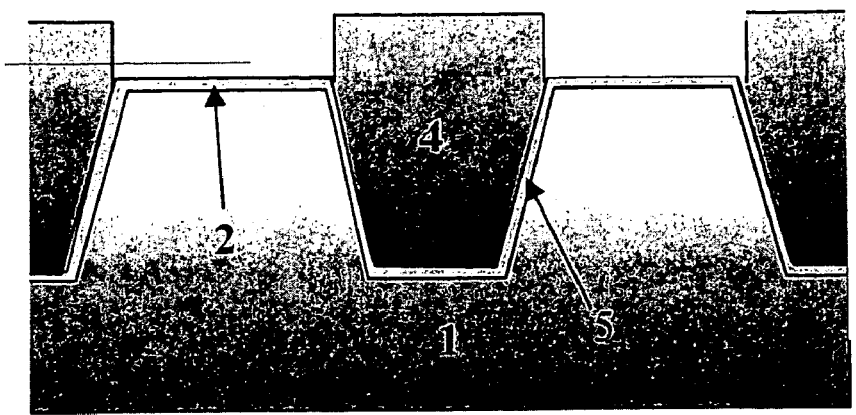
Figure 2A:
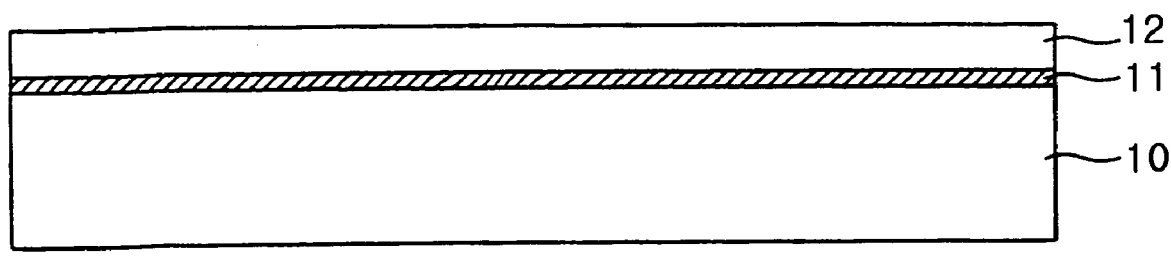
FIGS. 2a–2e illustrate, in cross-sectional views, the process steps according to another conventional STI fabricating method.
Figure 2B:
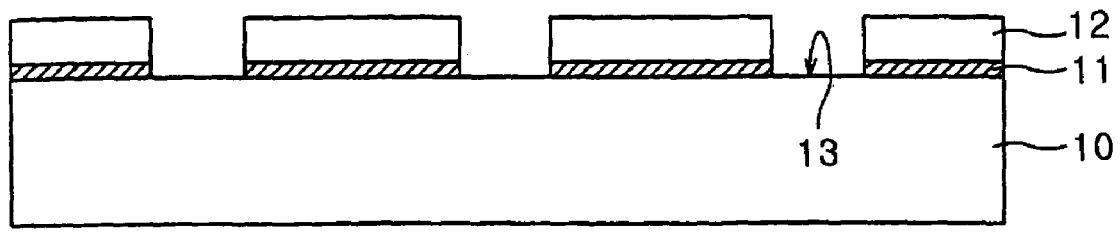
Figure 2C:
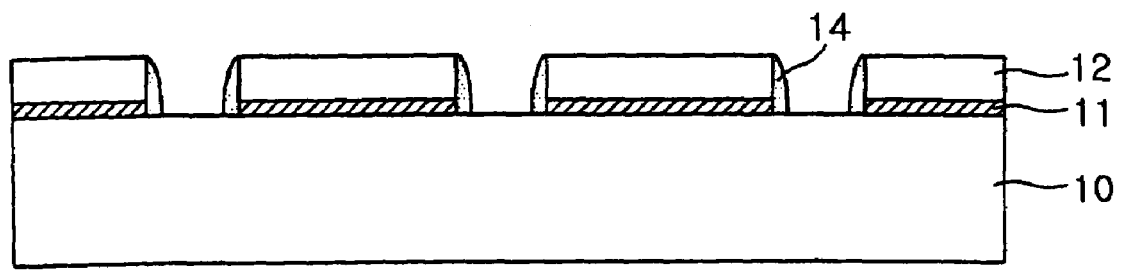
Figure 2D:
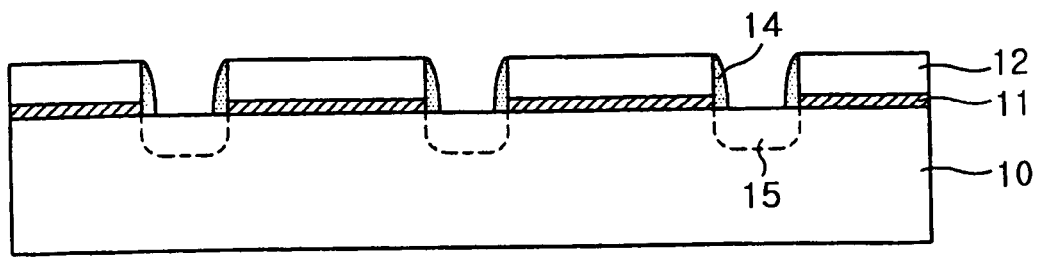
Figure 2E:
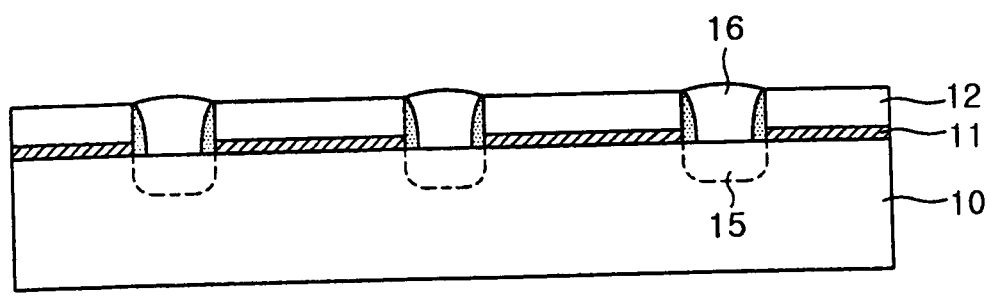
Figure 3A:
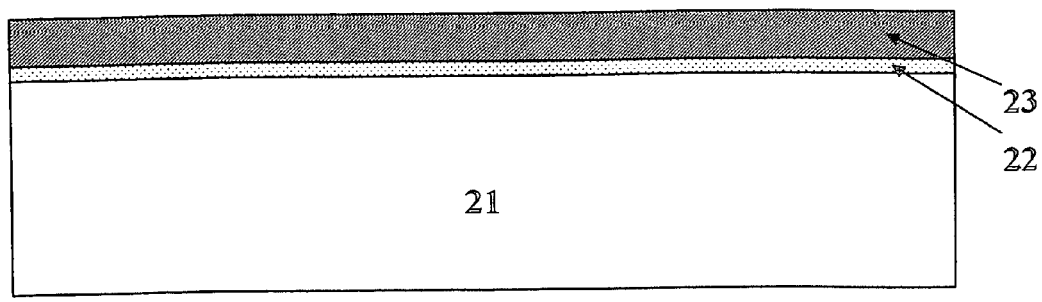
FIGS. 3a–3i illustrate, in cross-sectional views, the process steps for fabricating STI according to a preferred embodiment of the present invention.
Figure 3B:
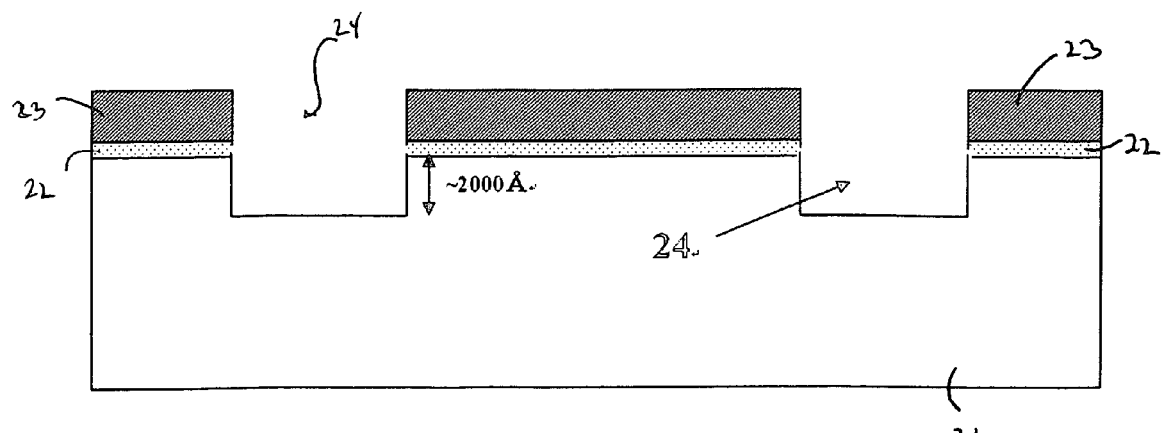

A pad oxide layer 22 is grown on a silicon substrate 21. A first nitride layer 23 is deposited on the pad oxide layer 22, as shown in FIG. 3a. A trench 24 is formed by patterning and etching the first nitride layer 23, the pad oxide layer 22, and the substrate 21, as shown in FIG. 3b. The substrate 21 is etched to a depth of source/drain. The depth is preferably 2000 Å. It is contemplated that the depth can be greater or less than 2000 Å.

Figure 3C:
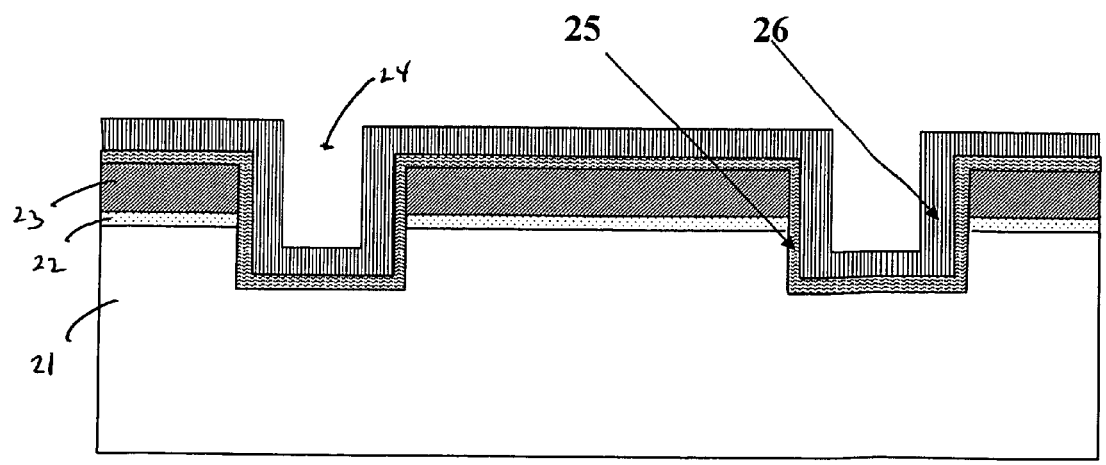

As shown in FIG. 3c, a tetraethyl orthosilicate ("TEOS") layer 25 is then deposited on the substrate 21. The TEOS layer 25 can preferably have a thickness between 225 Å and 325 Å. The TEOS layer 25 can be deposited by low pressure chemical vapor deposition ("LPCVD"). A second nitride layer 26 is deposited on the TEOS layer 25 by LPCVD. The second nitride layer 26 can preferably have a thickness between 250 Å and 350 Å instead of depositing the TEOS layer by LPCVD, a thermal oxide may be grown on the exposed silicon substrate. The TEOS layer 25 can be deposited on the thermal oxide by LPCVD.

Figure 3D:
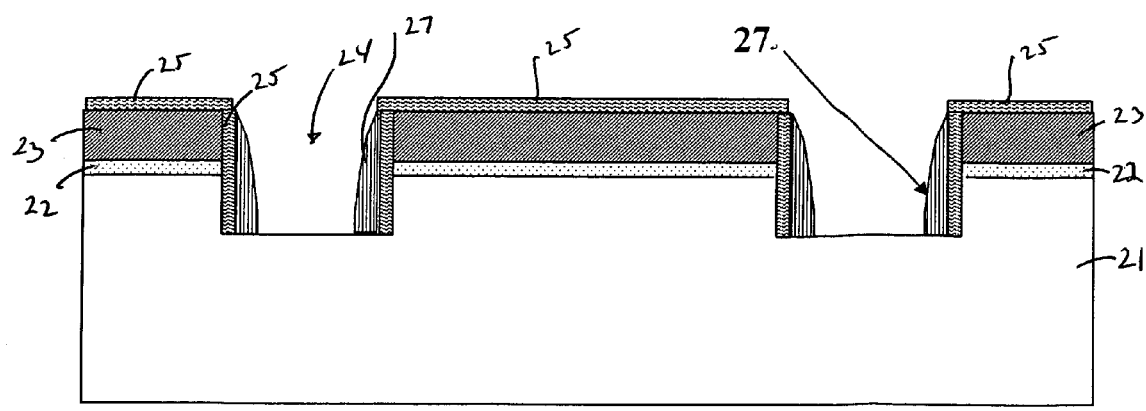

A nitride spacer 27 is formed by removing all of the nitride layer 26 except for the nitride on the lateral walls of the trench 24, as shown in FIG. 3d. This can be performed by blanket etching. The nitride spacer 27 prevents oxygen from penetrating into the lateral walls of the trench 2 and reacting with the silicon substrate 21 during a wet oxidation process. The substrate 21 is exposed in the bottom of the trench 24, as shown in FIG. 3d.

Figure 3E:
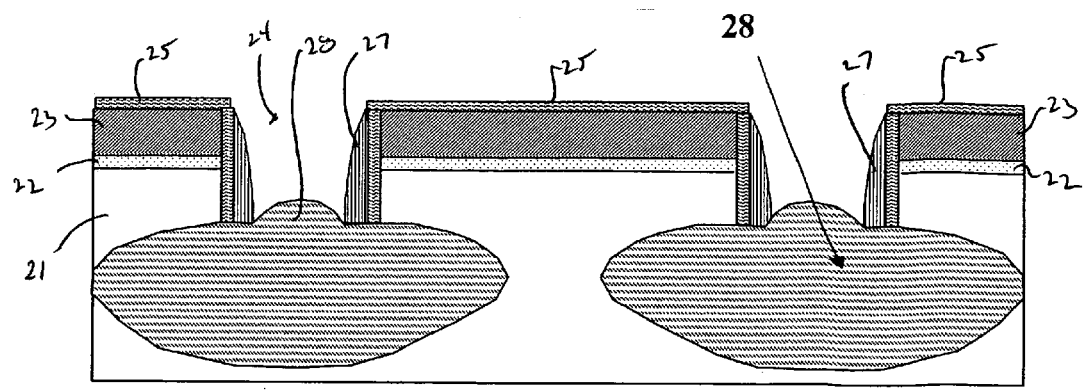
Figure 3F:
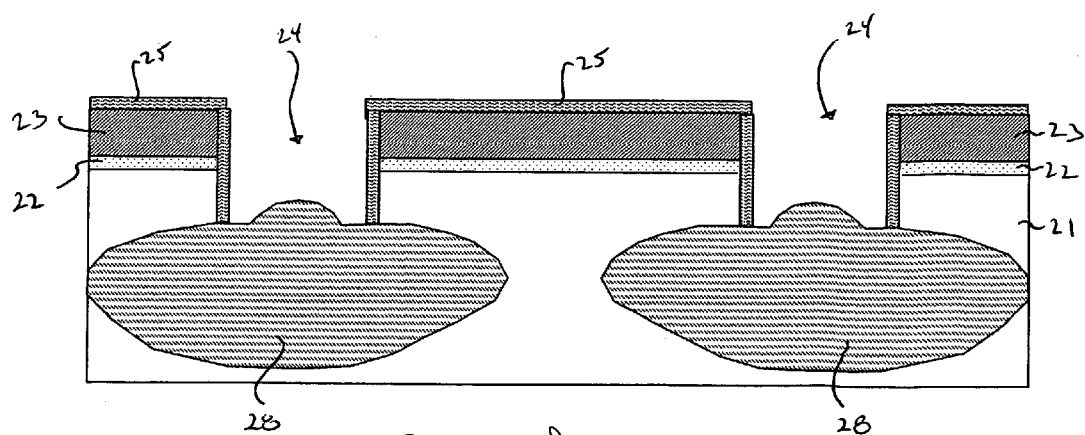
Figure 3G:
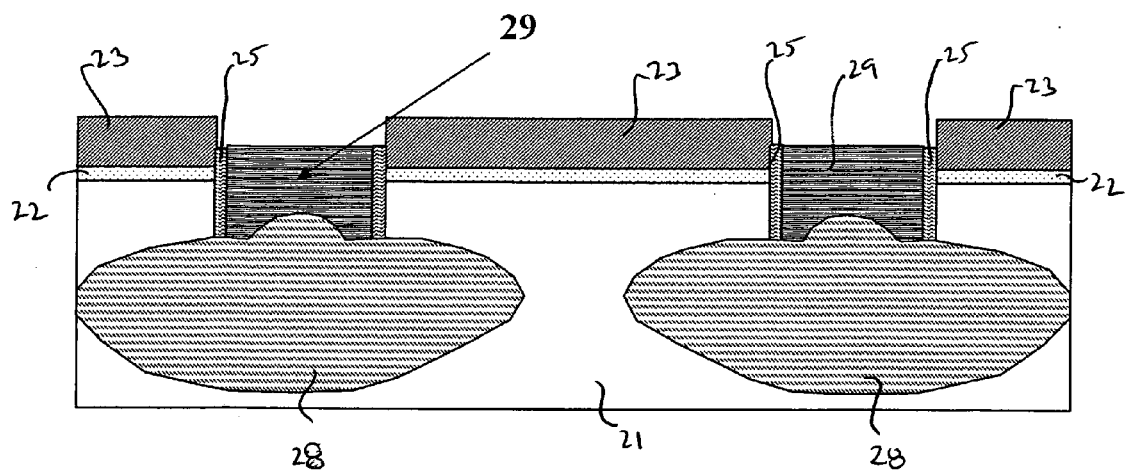
Figure 3H:
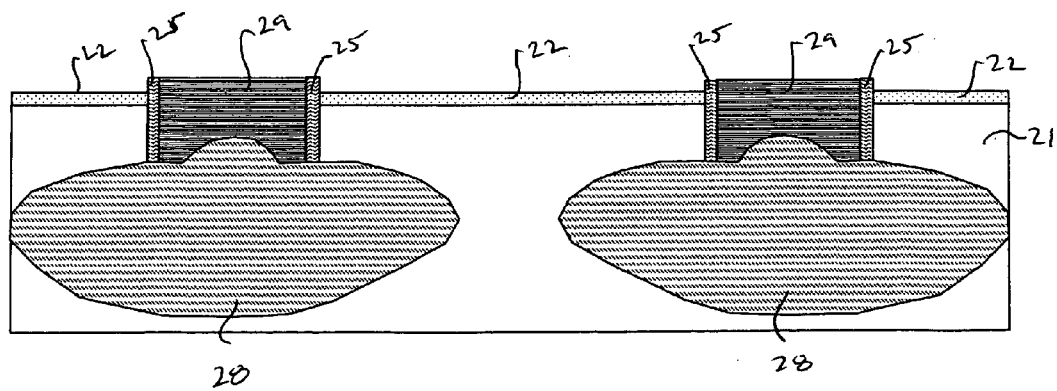

The exposed silicon substrate 21 is oxidized by a wet oxidation process. The oxidation of the silicon substrate 21 is performed horizontally, as well as, vertically. The oxide is not formed on the lateral walls of the trench 24 because the nitride spacer 27 prevents the penetration of oxygen. Instead, an oval-type buried oxide 28 is grown, as shown in FIG. 3e. The buried oxide 28 is preferably thicker than the P-well or N-well. The buried oxide 28 has an adequate width so that the buried oxide is not in contact with another adjacent buried oxide, as shown in FIG. 3e. The nitride spacer 27 can then be removed using an HF wet etch, as shown in FIG. 3f. An oxide 29 is deposited to fill the trench 24. The oxide 29 can be deposited by APCVD. Then, a densification process and a CMP process are performed in sequence. As shown in FIG. 3h, the remaining first nitride layer 23 is removed. The nitride layer 23 can be removed using phosphoric acid to form the STI structure.

Figure 3I:
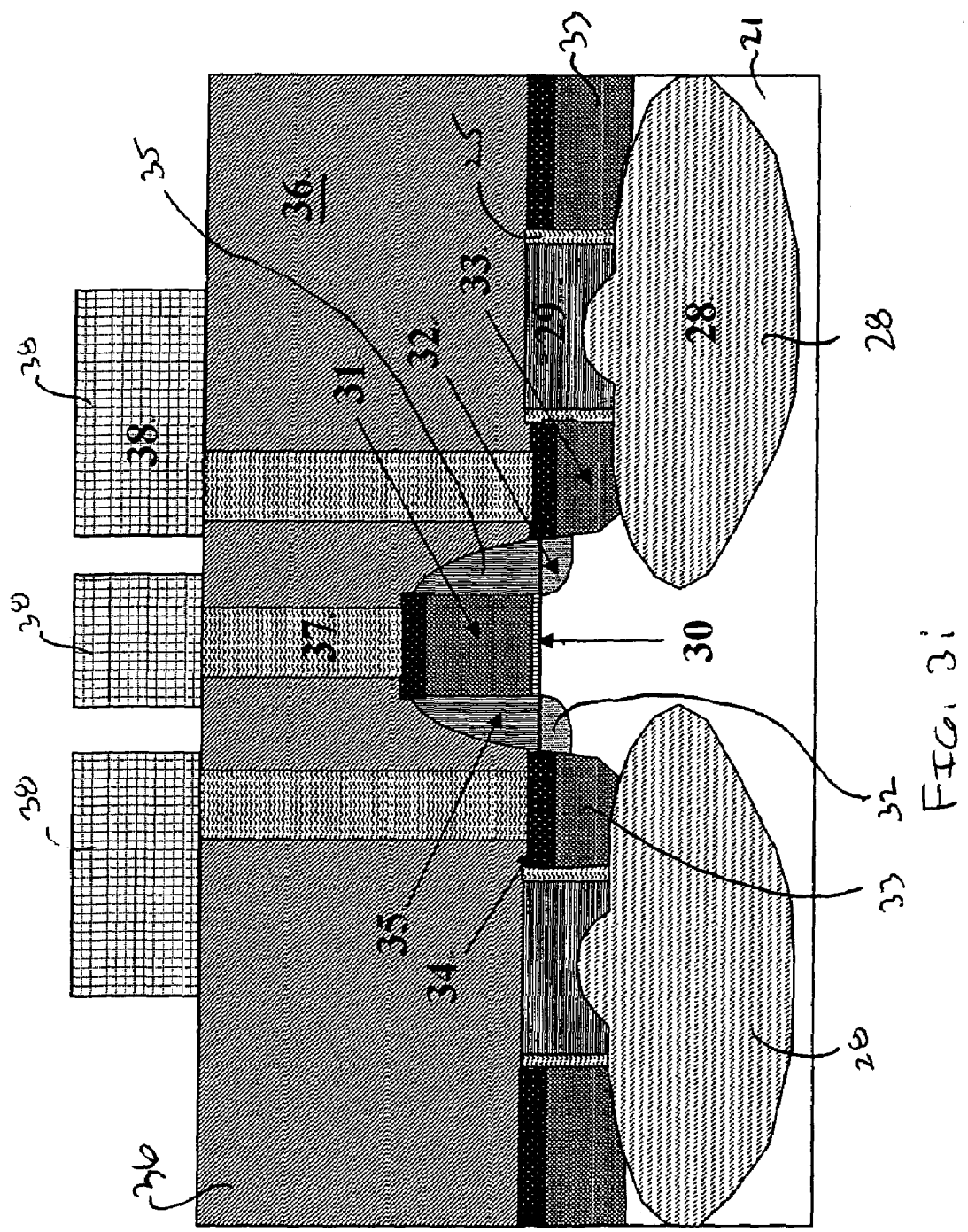

Subsequently, an adequate impurity is implanted into an active area by ion implantation, as illustrated in FIG. 3i. Here, the pad oxide layer 22 on the active area is used as a screening oxide. A gate insulation layer 30 is then grown and a polysilicon layer is deposited thereon. The gate insulation layer and the polysilicon layer are patterned and etched to form a gate 31. An LDD region 32 is then formed by ion implantation. A sidewall spacer 35 is formed on the lateral walls of the gate 31 by depositing a sidewall nitride layer and performing a blanket etch. A source/drain region 33 is formed by ion implantation. The source/drain region 33 is in contact with the buried oxide 18.

A silicide layer 34 is formed by a silicide process. Then, a pre-metal dielectric liner layer and pre-metal dielectric boron-phosphorus silicate glass ("PMDBPSG") layer 36 are deposited in turn, and planarized by CMP. A capping oxide is deposited on the PMD BPSG layer 36. At least one contact hole 37 is formed through a contact patterning/etching process. The contact hole 37 is filled with tungsten and flattened by CMP. Finally, through a metal process a source/drain electrode, a gate electrode and a body electrode collectively identified 38 are formed.

An STI fabricating method according to embodiments of the present invention can prevent formation of a parasitic source/drain junction capacitor because the bottom of the source/drain is in contact with the buried oxide, which substantially reduces total parasitic capacitance Furthermore, gate RC delay is reduced and the operating speed of the transistor increased. The STI fabricating method in accordance with embodiments of the present invention can substantially reduce junction leakage because the junction between the bottom of the source/drain and N-well or P-well is not formed, which reduces the consumption of electric power by an IC chip because a leakage current decreases.

The STI fabricating method can improve isolation characteristics of the P-well and the N-well because a junction between the P-well and the N-well is not formed because the buried oxide 28 is thicker than the P-well or the N-well, and can increase a circuit design margin due to the improvement of the latch-up characteristic.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a shallow trench isolation structure of semiconductor device comprising:
    forming a pad oxide layer and a first nitride layer on a substrate;
    forming a trench by etching at least a portion of the first nitride layer, the pad oxide layer, and the substrate;
    depositing an oxide layer and a second nitride layer on exposed surfaces of the first nitride layer, the pad oxide layer and the substrate including the trench;
    forming a spacer on lateral walls of the trench by etching the second nitride layer;
    growing a buried oxide in the substrate underneath the trench;
    filling the trench by depositing an insulating layer after removing the spacer; and
    performing a planarization process.

2. The method as defined by claim 1, wherein the oxide layer has a thickness of 225 Å to 325 Å.

3. The method according to claim 1, wherein the second nitride layer has a thickness of 250 Å to 350 Å.

4. The method as defined by claim 1, wherein the spacer is formed by etching the second nitride layer.

5. The method according to claim 4, wherein the spacer is formed by blanket etching the second nitride layer.

6. The method as defined by claim 1, wherein the buried oxide is formed underneath the trench and has a larger width than that of the trench.

7. The method according to claim 6, wherein the buried oxide has an oval shape.

8. The method according to claim 1, wherein the substrate is etched to an adequate depth.

9. The method according to claim 8, wherein the adequate depth is approximately 2000 Å.

10. The method as defined by claim 1, wherein the trench is formed so as to have the same depth as source/drain regions.

11. The method as defined by claim 1, wherein the buried oxide is formed such that an adequate space exists between the buried oxide and another adjacent buried oxide.

12. The method according to claim 1, wherein the buried oxide is grown by performing a thermal oxidation on the substrate.

13. The method as defined by claim 12, wherein the thermal oxidation to form the buried oxide is a wet oxidation.

* * * * *